United States Patent [19]

Boeijen et al.

[11] Patent Number: 5,450,011
[45] Date of Patent: Sep. 12, 1995

[54] MAGNETIC RESONANCE APPARATUS HAVING A WIDEBAND MATCHING NETWORK

[75] Inventors: Gerardus W. Boeijen; Peter H. Wardenier, both of Eindhoven, Netherlands

[73] Assignee: U.S. Philips Corporation, New York, N.Y.

[21] Appl. No.: 41,803

[22] Filed: Apr. 1, 1993

[30] Foreign Application Priority Data

May 7, 1992 [EP] European Pat. Off. ............ 92201295

[51] Int. Cl.6 ........................................... G01R 33/36
[52] U.S. Cl. ................................. 324/322; 324/318
[58] Field of Search ............... 324/318, 322, 300, 307, 324/309; 128/653.5

[56] References Cited

U.S. PATENT DOCUMENTS

| | | | |
|---|---|---|---|
| 4,095,168 | 6/1978 | Hlavka | 324/310 |
| 4,691,164 | 9/1987 | Haragashira | 324/322 |
| 4,694,255 | 9/1987 | Hayes | 324/318 |
| 4,700,137 | 10/1987 | Yoda | 324/322 |
| 4,739,271 | 4/1988 | Haase | 324/322 |
| 4,755,756 | 7/1988 | Nishihara et al. | 324/300 |
| 4,827,219 | 5/1989 | Harrison | 324/322 |
| 4,882,541 | 11/1989 | Haragashira | 324/322 |
| 4,885,541 | 12/1989 | Hayes | 324/322 |
| 4,920,315 | 4/1990 | Hokbrook et al. | 324/313 |
| 5,055,792 | 10/1991 | Keren | 324/318 |
| 5,172,061 | 12/1992 | Crooks et al. | 324/318 |

FOREIGN PATENT DOCUMENTS

0083728 7/1983 European Pat. Off. .

OTHER PUBLICATIONS

Journal of Physics E. Scientific Instruments, vol. 14, No. 6, 1 Jun. 1981, Bristol GB pp. 700–701.
Magnetic Resonance in Medicine, vol. 3, No. 2, 1 Apr. 1986, Duluth, Minn., pp. 346–351.
"Electronics", Jan. 1944, pp. 130–133 and 318–325.

*Primary Examiner*—Sandra L. O'Shea
*Assistant Examiner*—Raymond Y. Mah
*Attorney, Agent, or Firm*—Bernard Franzblau

[57] ABSTRACT

A magnetic resonance apparatus includes an RF coil tuned to a predetermined frequency and which is connected, via a connection circuit, to a transmission and-/or receiving device for RF signals. A connection circuit is provided in order to increase the bandwidth of the RF coil without imposing restrictions on the design and the construction of the coil. Therefore, viewed from the RF, the connection circuit successively includes the following elements:

a first matching network which is operative to transform an impedance connected to its output to a substantially lower value;

a circuit which has the properties of a transmission line whose effective length is substantially equal to an integer number of times one half wavelength at the frequency to which the RF coil is tuned and whose characteristic impedance is substantially equal to the input impedance of the first matching network; and a second matching network which is operative to transform an impedance connected to its output to a substantially higher value.

18 Claims, 4 Drawing Sheets

MAGNETIC RESONANCE APPARATUS HAVING A WIDEBAND MATCHING NETWORK

BACKGROUND OF THE INVENTION

This invention relates to a magnetic resonance apparatus, comprising a magnet system for generating a steady magnetic field, a coil system for generating gradient fields, and at least one RF coil which is tuned to a predetermined frequency and which is connected, via a connection circuit, to a transmission and/or receiving device for RF signals.

An example of such an apparatus is known from EP-A-0 083 728. The cited document explains that it is important to make the bandwidth in which an RF receiving coil can receive magnetic resonance signals generated by an object to be examined wider than the natural bandwidth of the coil. To this end, the known apparatus comprises an RF receiving coil which forms a part of a wide band impedance transforming network. This network comprises two coupled resonant circuits, the RF coil itself forming part of one of these resonant circuits and hence of the network itself. To this end, the RF coil should satisfy given requirements imposed by the network. As a result the designer is not free with respect to the choice of the construction of the RF coil. Optimum matching of the RF coil to the object of the measurements to be performed by means of this coil, therefore, will not always be possible. Moreover, it is not apparent from the cited document whether the RF coil can also be used as a transmission coil and if so, what steps are to be taken in that case.

SUMMARY OF THE INVENTION

It is an object of the invention to provide a magnetic resonance apparatus of the kind set forth in which the connection circuit provides an increased bandwidth of the RF coil without imposing restrictions of significance on the designer with respect to the construction of the RF coil, and in which the RF coil is in principle suitable for the transmission as well as the reception of RF signals. To achieve this, the apparatus in accordance with the invention is characterized in that, viewed from the RF coil, the connection circuit successively comprises the following elements:
  a first matching network which is operative to transform an impedance connected to its output to a substantially lower value;
  a circuit which has the properties of a transmission line whose effective length is substantially equal to an integer number of times one half wavelength at the frequency to which the RF coil is tuned and whose characteristic impedance is substantially equal to the input impedance of the first matching network; and
  a second matching network which is operative to transform an impedance connected to its output to a substantially higher value.

The connection circuit in accordance with the invention is suitable for transmission coils as well as for receiving coils and constitutes a wide band matching network between the RF coil and the transmission and/or receiving device. The transmission and/or receiving coil, which itself does not form a part of the matching network, may consist of an assembly of an arbitrary number of conductors and capacitors and also of known active and/or passive means for mutual decoupling of transmission and receiving coils, for example, PIN diodes.

A preferred embodiment of the apparatus in accordance with the invention is characterized in that the circuit having the properties of a transmission line is formed by a coaxial lead (line) having an inner conductor and a sheath, the sheath being grounded. In this embodiment the coaxial line can be used to bridge the distance between the RF coil and the transmission and/or receiving device. This is also the case in another embodiment which is characterized in that the second matching network comprises a coaxial lead having an inner conductor and a sheath, the sheath being grounded.

A further preferred embodiment of the apparatus in accordance with the invention is characterized in that the second matching network comprises a capacitor which is connected between a signal lead and a ground lead and also comprises a coil which is inserted in the signal lead, that the circuit having the properties of a transmission line comprises a series connection of a coil and a capacitor which is inserted in the signal lead, and that both said coils are constructed as a single, combined coil. This embodiment can be simply realised using only a limited number of components. The first matching network may have a very simple construction in an embodiment which is characterized in that the first matching network comprises a capacitor and a coil, one of these components being inserted in a signal lead whereas the other component connects the signal lead to a ground lead.

Known magnetic resonance apparatus often comprise two RF coils which are combined so as to form a quadrature coil system and each of which is connected, via a respective connection circuit, to a transmission and/or receiving device. Such apparatus can also be improved by taking the steps in accordance with the invention. A preferred embodiment of such an apparatus is characterized in that the first matching network of each of the connection circuits is constructed as a balun. A balun is a transformer enabling connection of a balanced system to an unbalanced system. An unbalanced system comprises a grounded lead and a signal lead, and a balanced system comprises two non-grounded signal leads. Because the quadrature coil system in the present embodiment is connected to the connection networks via the first matching networks constructed as baluns, the occurrence of a ground loop is prevented in that both grounded leads of the two connection networks are connected to the quadrature coil system at different locations.

A further preferred embodiment of the apparatus in accordance with the invention is characterized in that the bandwidth of the matching network formed by the connection circuit is adjustable. This embodiment offers the advantage that, if desirable, the bandwidth can be chosen, for example, so as to be large during transmission and small during reception. If desirable, a number of the components constituting the connection circuit may be constructed so as to be adjustable.

BRIEF DESCRIPTION OF THE DRAWING

These and other aspects of the invention will be described in detail hereinafter with reference to the accompanying drawing, in which.

DESCRIPTION OF THE PREFERRED EMBODIMENTS

Figure 1:
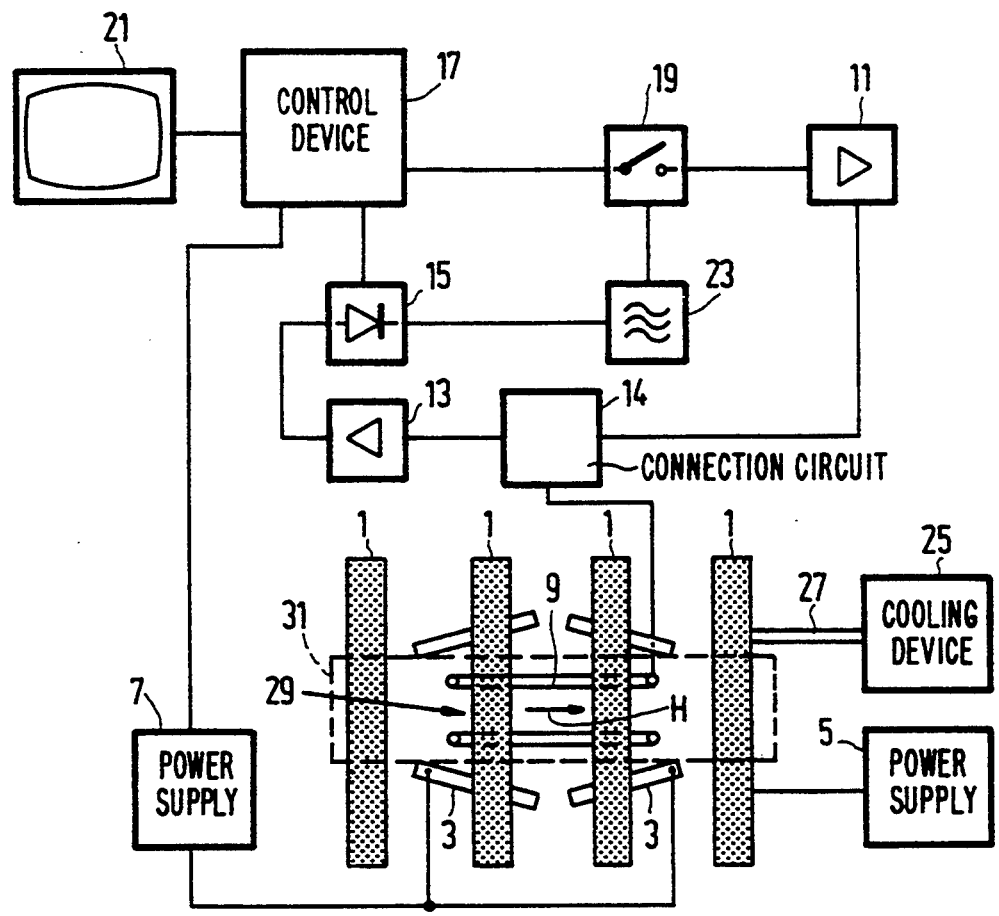
FIG. 1 shows diagrammatically an embodiment of a magnetic resonance apparatus in accordance with the invention.

The magnetic resonance apparatus which is diagrammatically shown in FIG. 1 comprises a first magnet system 1 for generating a steady magnetic field H, a second magnet system 3 for generating magnetic gradient fields, and first and second power supply sources 5 and 7 for the first magnet system 1 and the second magnet system 3, respectively. An RF coil 9 serves to generate an RF magnetic alternating field. To this end, it is connected to an RF source 11. For detection of nuclear spin resonance signals generated by the RF transmitted field in an object to be examined (not shown), use can also be made of the RF coil 9. To this end, this coil is connected to a signal amplifier 13. The connection between the RF source 11 or the signal amplifier 13 on the one side and the RF coil 9 on the other side is realised via a connection circuit 14 which will be described in detail hereinafter. The output of the signal amplifier 13 is connected to a detector circuit 15 which is connected to a central control device 17. The central control device 17 also controls a modulator 19 for the RF source 11, the second power supply source 7, and a monitor 21 for image display. An RF oscillator 23 controls the modulator 19 as well as the detector 15 processing the measurement signals. For cooling, if any, of the magnet coils of the first magnet system 1 there is provided a cooling device 25 comprising cooling ducts 27. A cooling device of this kind may be constructed as a water-cooling system for resistive coils or, as for the high field strengths required in the present case, for example, as a liquid-helium cooling system for superconducting magnet coils. The RF coil 9, arranged within the magnet systems 1 and 3, encloses a measurement space 29 which is large enough to enclose a patient to be examined, or a part of a patient to be examined, for example, the head and the neck, in an apparatus for medical diagnostic measurements. Thus, in the measurement space 29 there can be generated a steady magnetic field H, gradient fields for selecting object slices, and a spatially uniform RF alternating field. The RF coil 9 can combine the functions of transmitter coil and measuring coil and is in that case alternately connected to the RF source 11 and the signal amplifier 13 by the central control device 17. Alternatively, different coils can be used for the two functions, for example, surface coils acting as measuring coils. In that case a connection circuit 14 is provided for the RF transmitter coil as well as for the RF measuring coil. Hereinafter, the RF coil 9 will generally be referred to only as a measuring coil. For the use of the coil as a transmission coil the same considerations apply in conformity with the theorem of reciprocity. If desired, the coil 9 may be enclosed by a Faraday cage 31 for shielding RF fields.

Figure 2:
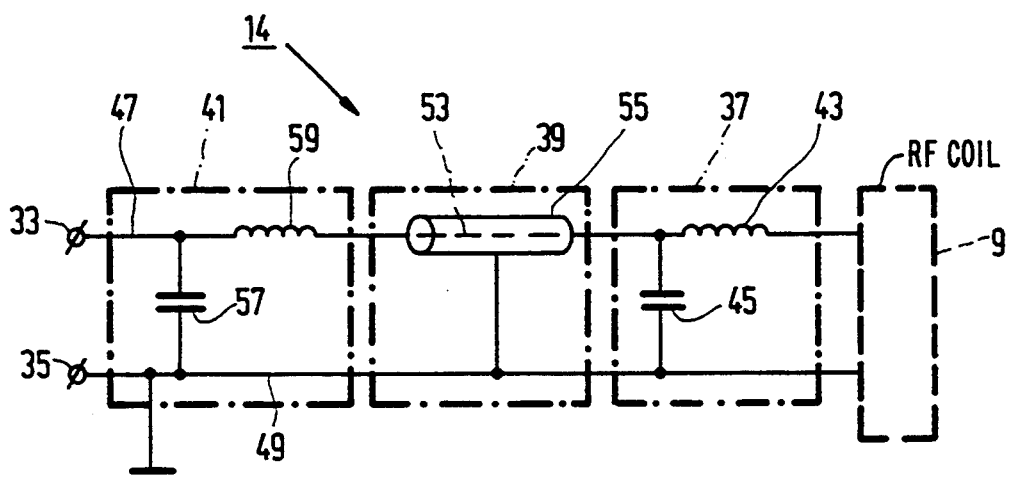
FIG. 2 shows a circuit diagram of a first embodiment of a connection network for use in the apparatus shown in FIG. 1.

FIG. 2 shows a circuit diagram of a first embodiment of the connection circuit 14 shown in FIG. 1. The connection circuit 14 is connected on the one side to the RF coil 9, denoted by dashed lines in FIG. 2, and on the other side comprises first and second connection terminals 33 and 35 which can be connected to the RF source 11 and/or the signal amplifier 13. The connection circuit 14 consists of a number of elements which are denoted by dash-dot boxes in FIG. 2 for the sake of clarity. Viewed from the RF coil 9, these elements are successively: a first matching network 37, a circuit 39 having the properties of a transmission line, and a second matching network 41. In the present embodiment, the first matching network 37 consists of a coil 43 and a capacitor 45. The coil 43 is inserted in a signal lead 47 which connects the RF coil 9 to the first connection terminal 33. The capacitor 45 connects the signal lead 47 to a ground lead 49 which connects the RF coil to the second connection terminal 35. In the present embodiment the circuit 39 is formed by a coaxial line which is inserted in the signal lead 47 and which comprises an inner conductor 53 (denoted by a dashed line) and a sheath 55 which is grounded via the ground lead 49. The second matching network 41 of the present embodiment consists of a capacitor 57, connected between the signal lead 47 and the ground lead 49, and a coil 59 which is inserted in the signal lead 47.

Figure 3:
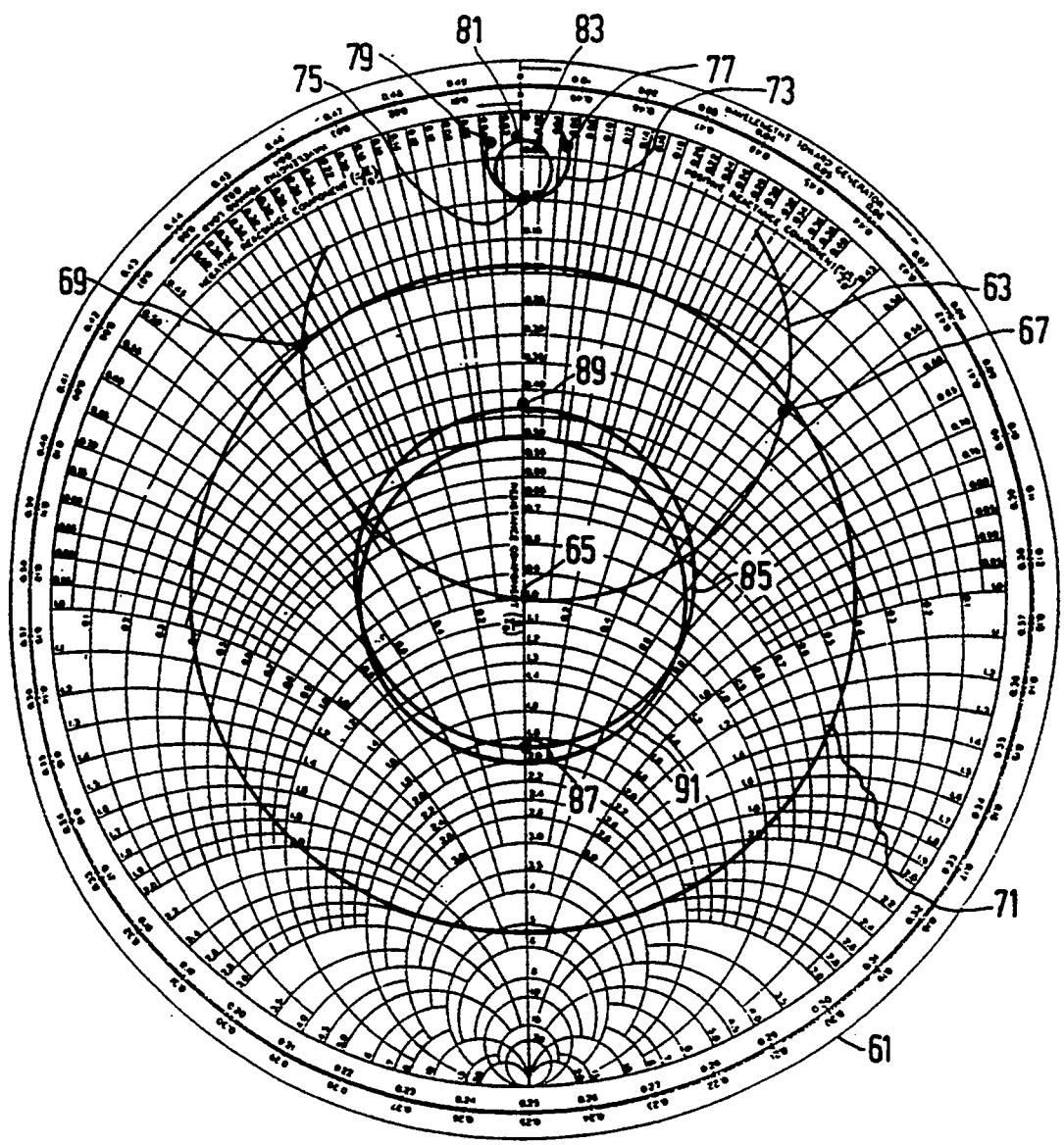
FIG. 3 shows a diagram illustrating the operation of the circuit shown in FIG. 2.

The RF coil 9 is tuned to a predetermined frequency $f_0$ in a customary manner as described in EP-A-0 083 728. At this frequency the RF coil 9 has a (real) impedance $R_9$. The first matching network 37 is of a type which is known per se and which is used as customary to transform the impedance of an RF coil 9 connected thereto to a given, real reference impedance $R_0$ which is equal to the impedance of the RF source 11 or the signal amplifier 13 connected to the input of the matching network. If matching is realised exclusively by means of such a network, the RF coil can be used only in a very narrow frequency band. Outside of this narrow frequency band, impedance matching is then very poor, resulting in a high power loss. This can be readily demonstrated on the basis of FIG. 3 which shows a Smith chart 61 (see, for example, Electronics, January 1944, pp. 130–133 and 318–325). A curve 63 in the Smith chart 61 represents the variation of the impedance on the input of such a narrow band matching network as a function of the frequency upon a variation of this frequency between $f_0 - \Delta f$ and $f_0 + \Delta f$, where $f = 21.3$ MHz and $\Delta f = 0.1$ MHz. The reference impedance $R_0$ is chosen to be equal to 50 Ω so that all impedance values read in the Smith chart should be multiplied by 50. The centre of the Smith chart corresponds to the reference impedance $R_0$ (the point denoted by the reference numeral 65 in FIG. 3. The input impedance $Z_{in}$ in Ω then amounts to 50 for $f = 21.3$ MHz (point 65 on the curve 63), to $12 + j24$ for 21.2 MHz, and to $10 - j17$ for $f = 21.4$ MHz. In the Smith chart, circles having the centre 65 of the chart as their centre interconnect points of the same standing wave ratio (VSWR). For the reference impedance (point 65), the VSWR equals 1, so that no power loss occurs. The points 67 and 69 are situated on a circle 71 which corresponds to a VSWR of approximately 5.7. This leads to a power loss amounting to approximately 3 dB. This demonstrates that a comparatively small deviation of the frequency already leads to a considerable power loss when matching is realised exclusively by means of a narrow band matching network.

The connection circuit 14, however, is designed so that a small, substantially constant power loss occurs across the entire desired frequency band. To this end, the first matching network 37 is operative to transform an impedance connected to its output to a substantially lower value. In the present embodiment, the first matching network 37 transforms the impedance on its output to a value which is ten times smaller. The impedances at frequencies of 21.3 MHz, 21.2 MHz and 21.4 MHz then become 5.0 $\Omega$ 1.2+j2.4 $\Omega$, and 1.2−j1.7 $\Omega$, respectively. This results in the curve 73 with the points 75, 77 and 79, respectively, in FIG. 3.

The circuit 39 has the properties of a transmission line whose effective length at the frequency $f_0$ is substantially equal to one half wavelength and whose characteristic impedance at $f_0$ is substantially equal to the input impedance of the first matching network 37 at the frequency $f_0$. A transmission line of this kind, inter alia, has the property that it produces (at the frequency $f_0$) an impedance transformation which corresponds to a rotation of exactly 360° in the Smith chart. The impedance corresponding to the point 75 is thus transformed to the same value. For a lower frequency $f_0 - \Delta f$, the wavelength is greater and hence the length of the transmission line is smaller than one half wavelength. This means that the point 77 will be rotated through slightly less than 360°. Conversely, the rotation for a higher frequency $f_0 + \Delta f$ is slightly more than 360°. As a result, after the transformation by the circuit 39, the impedances for the frequencies 21.2 and 21.4 MHz coincide at a value of 1.2 $\Omega$, i.e. at the point 81. The overall impedance variation between 21.2 and 21.4 MHz is represented by the curve 83.

The second matching network 41 is operative to transform an impedance connected to its output to a substantially higher value. If the impedance of the capacitor 57 equals $Z_c$ for the frequency $f_0$ and the impedance of the coil ,equals $Z_L$, an impedance $R_i$ connected to the input of the second matching network 41 is transformed to a value $R_u$, where:

$$R_u \cdot R_i = Z_c Z_L.$$

If the values of the capacitor 57 and the coil 59 are chosen so that for $f=f_0$ the impedances $Z_c$, and $Z_L$ are equal:

$$R_u = = Z_c^2 / R_i.$$

For example, for $Z_c = 10.5$ $\Omega$, the impedance variation according to the curve 83 is transformed to a curve 85. At 21.2 and 21.4 MHz, the impedance is then 93 $\Omega$ (point 87) and 22 $\Omega$ at 21.3 MHz (point 89). The curve 85 is then almost coincident with a circle 91 corresponding to a VSWR of approximately 2.1. Across the entire said frequency band the power loss is then approximately equal to 1 dB. If desirable, the capacitor 57 and the coil 59 can be made variable while maintaining the condition $Z_L = Z_c$. Thus, the curve obtained as the final result of the transformation can be shifted along the axis $jX=0$ (the vertical axis in FIG. 3). For example, the impedances at 21.2 and 21.4, and 21.2 MHz, respectively, then become equal to 208 $\Omega$ and 50 $\Omega$, respectively, for $Z_c = 15.8$ $\Omega$ and for $Z_c = 7.75$ $\Omega$ equal to 50 $\Omega$ and 12 $\Omega$, respectively. The bandwidth of the matching network formed by the connection circuit 14 is thus rendered adjustable.

Figure 4:
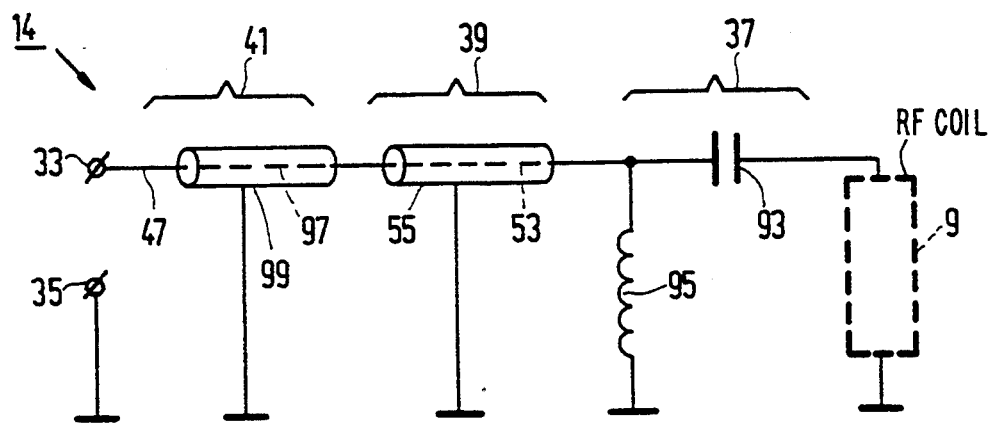
FIG. 4 shows a circuit diagram of a second embodiment of a connection network for use in the apparatus shown in FIG. 1.

FIG. 4 shows a second embodiment of the connection circuit 14, wherever possible the same reference numerals being used for components corresponding to FIG. 2. In the present embodiment, the first matching network 37 consists of a capacitor 93 which is inserted in the signal lead 47 and of a coil 95 which is connected between the signal lead and ground. In the present embodiment the circuit 39 is again formed by a coaxial lead 53, 55 which is connected in the same way as in the first embodiment. The second matching network 41 is formed by a coaxial lead having an inner conductor 97 inserted in the signal lead 47, and a grounded sheath 99. The coaxial leads 53, 55 and 97, 99 are very suitable for bridging the distance between the RF coil 9 and the RF source 11 and/or the signal amplifier 13 connected to the connection terminals 33 and 35.

Figure 5:
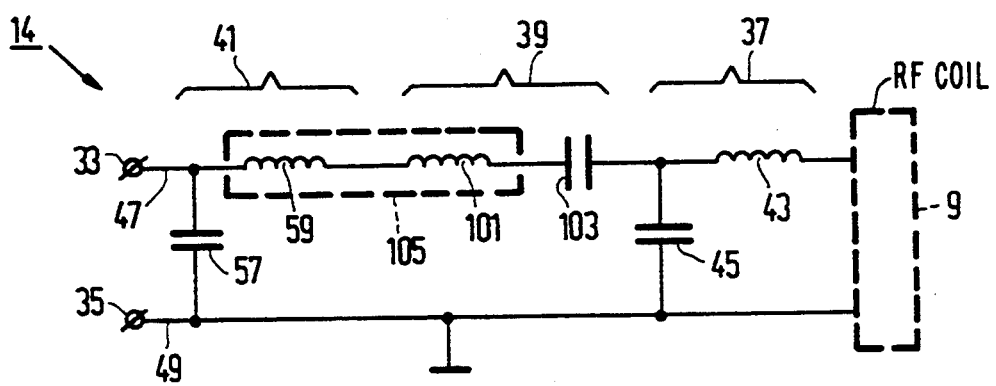
FIG. 5 shows a circuit diagram of a third embodiment.

FIG. 5 shows a third embodiment of the connection circuit 14 in which the circuit 39 as well as the second matching network 41 consists of an LC network. The first matching network 37 is constructed, in the same way as in FIG. 2, by means of a coil 43 and a capacitor 45. A transmission line having a length of one half wavelength and a characteristic impedance $Z_k$ at a frequency $f_0$ can be replaced by a series connection of a coil having an inductance $L_k$ and a capacitor having a capacitance $C_k$, a ground lead being connected parallel thereto. The values of these components should then be chosen so that $2\pi f_0 k = \frac{1}{2}\pi f_0 C_{k=Zk}$. In the third embodiment the coaxial lead 53, 55 is replaced by such a circuit comprising a coil 101 and a capacitor 103 which are connected in series in the signal lead 47 extending parallel to the ground lead 49. As in the first embodiment shown in FIG. 2, the second matching network 41 consists of a capacitor 57 and a coil 59. As is clearly shown in FIG. 5, the two coils 59 and 101 are connected in series in the signal lead 47. It is then also possible to reduce the number of components by one by constructing these two coils as a single, combined coil 105 which is denoted by dashed lines in FIG. 5. In order to minimize the losses in the connection circuit 14, it is important to ensure that the quality factor of the combined coil 105 amounts to at least approximately 500. The bandwidth of the matching network, if desired, can be rendered adjustable again by constructing the capacitors 57 and 103 to be variable.

Figure 6:
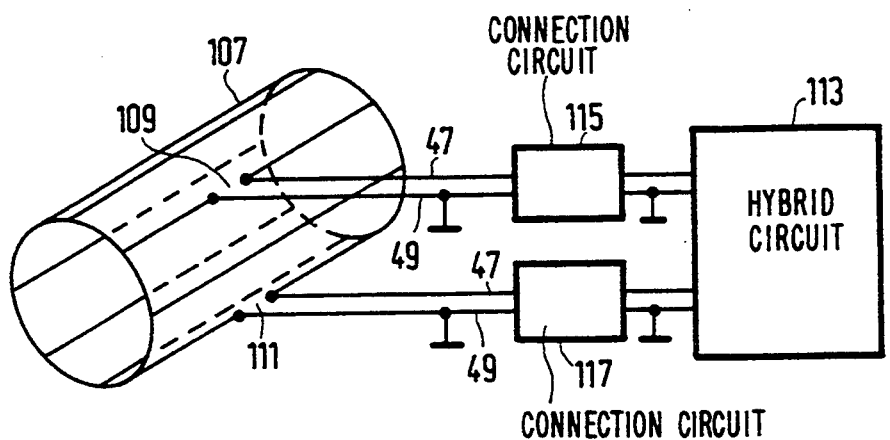
FIG. 6 shows diagrammatically a quadrature coil system.

FIG. 6 is a simplified representation of an embodiment of a so-called birdcage coil 107. A more detailed description of this type of coil is given, for example, in U.S. Pat. No. 4,694,255. According to the cited document such a coil can be used as two RF coils combined so as to form a quadrature coil system. To this end, the birdcage coil 107 can be excited or sensed at two points 109 and 111, 90° offset along its circumference, via a known 90° hybrid circuit 113. Each of these points is connected, via a respective connection circuit 115 and 117, respectively, to the hybrid circuit 113 and via the latter circuit to a transmission device (for example, the RF source 11) and/or a receiving device (for example, the signal amplifier 13). In the magnetic resonance technique, however, many other embodiments of quadrature coil systems are also known, for which the following description also holds.

It is in principle possible to construct each of the connection circuits 115, 117 in the same way as the circuit 14 in one of the embodiments described above. In that case, however, a ground lead 49 is connected to each of the points 109 and 111. The ground leads ultimately meet at the hybrid circuit 113, thus forming a ground loop which is liable to cause interference. In order to prevent this, the connection circuits 115, 117 are preferably constructed so that no grounded leads are connected to the points 109 and 111.

Figure 7:
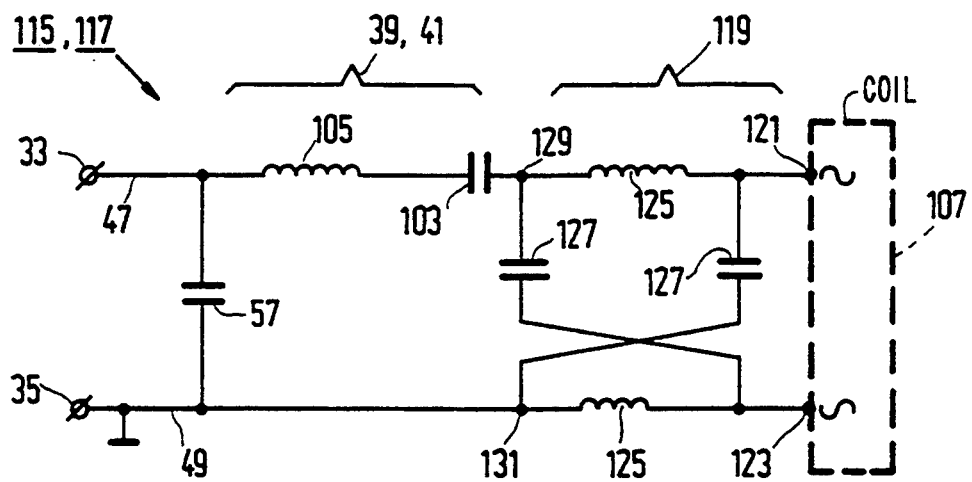
FIG. 7 shows a circuit diagram of an embodiment of a connection network which is particularly suitable for use in conjunction with a quadrature coil system.

FIG. 7 shows an embodiment of a connection circuit 115, 117 satisfying this condition. The second matching network 41 and the circuit 39 are constructed as described with reference to FIG. 5, so that they need not be further elaborated. The first matching network 119 of the present embodiment is constructed as a balun. A balun or 180° hybrid circuit is a transformer enabling a transition to be made between an unbalanced system (such as the circuit 39 with its signal lead 47 and the ground lead 49) and a balanced system, the latter being a system comprising non-grounded, symmetrical connections 121 and 123. Baluns are frequently used, for example, for connecting a coaxial lead (asymmetric) to a dipole antenna (symmetrical). In the embodiment shown the balun consists of two identical coils 125 and two identical capacitors 127, one of the coils 125 being inserted in each connection between one of the terminals 121 and 123 and a corresponding input 129 and 131, respectively, of the circuit 39, one of the capacitors 127 being connected between each of the terminals 121 and 123 and the other input 131 and 129, respectively. The terminals 121 and 123 then carry the same and opposed voltages relative to ground.

A number of embodiments of connection circuits has been described above. It will be evident that other embodiments are also feasible. For example, different connection circuits can be used for transmission and reception. Examples in this respect are shown in the form of block diagrams in the FIGS. 8 and 9.

Figure 8:
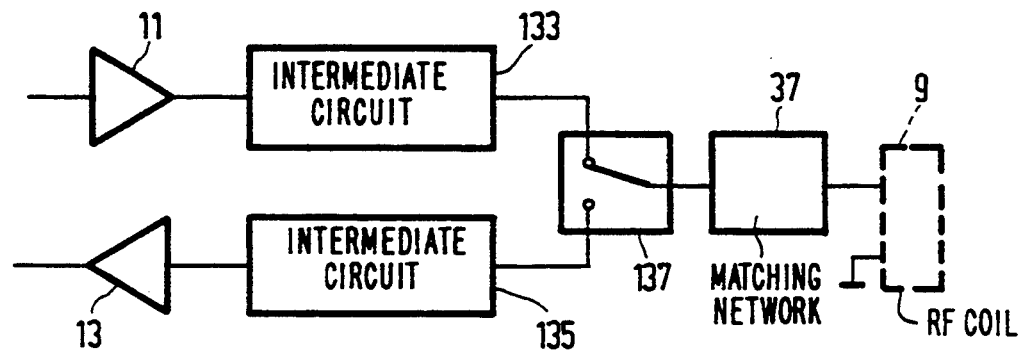
FIGS. 8 and 9 show block diagrams of two embodiments comprising different connection circuits for transmission and reception.

In the embodiment shown in FIG. 8, the RF source 11 is connected to a first intermediate circuit 133 and the signal amplifier 13 is connected to a second intermediate circuit 135. The first and second intermediate circuits 133 and 135 are connected, via a transmission/reception switch 137, to the first matching network 37 which may be constructed, for example in the same way as shown in FIGS. 2, 4 and 5. The transmission/reception switch 137 is controlled by the central control device 17. The first intermediate circuit 133 consists of, for example, the networks 39 and 41, see the FIGS. 2, 4 and 5. The second intermediate circuit 135 may be constructed in the same way, although the components will generally have values which deviate from those of the components in the first-intermediate circuit. However, the second intermediate circuit may also have a simpler construction; for example, it may be constructed as a single connection lead. In conjunction with the first matching network 37, the first and second intermediate circuits 133 and 135 constitute two connection circuits.

Figure 9:
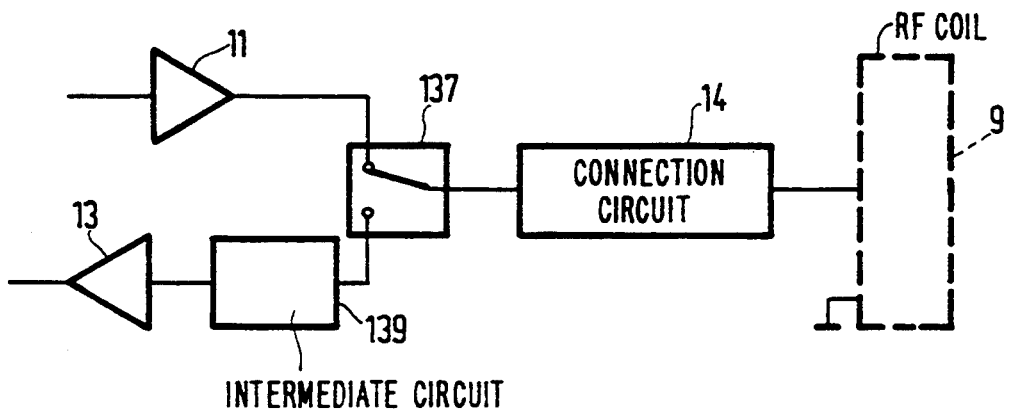

In the embodiment shown in FIG. 9, the RF source 11 is connected to the RF coil 9 via the transmission/reception switch 137 and a connection circuit 14, for example, of the type described with reference to FIGS. 2, 4 or 5. The signal amplifier 13 is connected to the transmission/reception switch 137 via a third intermediate circuit 139. The third intermediate circuit 139 comprises, for example, a matching network of the same type as the network 37 which is operative to transform the output impedance of the connection circuit 14 to a value which is suitable to achieve optimum noise behaviour of the signal amplifier 13, for example, 1 k$\Omega$. The connection circuit 14 and the third intermediate circuit 139 together constitute a new connection circuit.

We claim:

1. A magnetic resonance apparatus comprising; a magnet system for generating a steady magnetic field, a coil system for generating gradient fields, and at least one RF coil which is tuned to a predetermined frequency and which is connected, via a connection circuit, to at least one of a transmission and a receiving device for RF signals, wherein viewed from the RF coil, the connection circuit comprises the following elements coupled in cascade:

a first matching network having an output coupled to said one RF coil and which is operative to transform an impedance connected to its output to a substantially lower value;

a circuit which has the properties of a transmission line whose effective length is substantially equal to an integer number of times one half wavelength at the predetermined frequency to which the RF coil is tuned and whose characteristic impedance is substantially equal to the input impedance of the first matching network; and a second matching network having an output coupled to said circuit and which is operative to transform an impedance connected to its output to a substantially higher value.

2. A magnetic resonance apparatus as claimed in claim 1, wherein the circuit having the properties of a transmission line comprises a coaxial line having an inner conductor and a sheath the sheath being grounded.

3. A magnetic resonance apparatus as claimed in the claim 1 wherein the second matching network comprises a coaxial line having an inner conductor and a sheath, the sheath being grounded.

4. A magnetic resonance apparatus as claimed in claim 1, wherein the second matching network comprises a capacitor connected between a signal lead and a ground lead and also comprises a coil which is connected in the signal lead, wherein the circuit having the properties of a transmission line comprises a series connection of a coil and a capacitor which are connected in the signal lead, and wherein both said coils are constructed as a single, combined coil.

5. A magnetic resonance apparatus as claimed in claim 1 wherein the first matching network comprises a capacitor and a coil, one of these components being connected in a signal lead whereas the other component connects the signal lead to a ground lead.

6. A magnetic resonance apparatus as claimed in claim 1, comprising two RF coils which are combined so as to form a quadrature coil system and each of which is connected, via a respective connection circuit, to at least one of a transmission and a receiving device, wherein the first matching network of each of the connection circuits comprises a balun.

7. A magnetic resonance apparatus as claimed in claim 1 wherein the bandwidth of the matching network formed by the connection circuit is adjustable.

8. A wideband impedance matching network for coupling an RF coil of a magnetic resonance apparatus to at least one of a transmission and a receiving device of the magnetic resonance apparatus, said RF coil having a characteristic impedance at a predetermined frequency to which it is tuned, said impedance matching network comprising, in cascade, as viewed from an RF coil:
- a first impedance matching network having a first terminal for coupling to the RF coil and a second terminal, said first impedance matching network being operative to transform an impedance coupled to the first terminal to a substantially lower impedance value than said characteristic impedance of the RF coil,
- a coupling circuit which has the properties of a transmission line whose effective length is substantially equal to an integer number of times one-half wavelength at said predetermined frequency and having a characteristic impedance substantially equal to the impedance of the first impedance matching network looking into its second terminal, said coupling circuit being coupled to the second terminal of the first impedance matching network, and
- a second impedance matching network having a first terminal for coupling to a transmission or receiving device of the magnetic resonance apparatus and a second terminal coupled to said coupling circuit, said second impedance matching network being operative to transform an impedance connected to its second terminal to a substantially higher impedance value.

9. The wideband impedance matching network as claimed in claim 8 wherein the coupling circuit comprises a coaxial line having a grounded sheath and an inner conductor coupling the second terminal of the first impedance matching network to the second terminal of the second impedance matching network.

10. The wideband impedance matching network as claimed in claim 8 wherein the first impedance matching network comprises a capacitor and an inductor connected in a series circuit between said first terminal thereof and a ground lead.

11. The wideband impedance matching network as claimed in claim 10 wherein the second impedance matching network comprises a capacitor and an inductor connected in a series circuit between said second terminal thereof and a ground lead.

12. The wideband impedance matching network as claimed in claim 8, wherein said first impedance matching network comprises a circuit separate and distinct from said RF coil and said second impedance matching network includes only passive elements.

13. The wideband impedance matching network as claimed in claim 8, wherein said RF coil functions as both a transmitting and a receiving coil of the magnetic resonance apparatus.

14. The wideband impedance matching network as claimed in claim 8, wherein said RF coil is coupled to said coupling circuit via a first impedance matching network comprising only bidirectional passive electric components.

15. The magnetic resonance apparatus as claimed in claim 1, wherein said first matching network comprises a circuit separate and distinct from said RF coil whereby the physical construction of the RF coil is independent of the first matching network.

16. The magnetic resonance apparatus as claimed in claim 1, wherein said transmission line circuit comprises a coaxial cable and said first and second matching networks match their said respective connected impedances to the characteristic impedance of said coaxial cable.

17. The magnetic resonance apparatus as claimed in claim 1, wherein said first and second matching networks each comprise only passive inductance and capacitance elements.

18. The magnetic resonance apparatus as claimed in claim 1, wherein said RF coil is arranged to function as both the transmitting and the receiving coil of the magnetic resonance apparatus.

* * * * *